(12) United States Patent
Yin

(10) Patent No.: US 7,697,287 B2
(45) Date of Patent: Apr. 13, 2010

(54) MOUNTING APPARATUS FOR FAN

(75) Inventor: Xiu-Zhong Yin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 265 days.

(21) Appl. No.: 11/863,294

(22) Filed: Sep. 28, 2007

(65) Prior Publication Data
US 2009/0034191 A1    Feb. 5, 2009

(30) Foreign Application Priority Data
Aug. 2, 2007    (CN)    ......... 2007 2 0200767

(51) Int. Cl.
*H05K 7/20* (2006.01)
*F01D 25/24* (2006.01)

(52) U.S. Cl. .............. 361/695; 361/679.48; 415/213.1; 454/184

(58) Field of Classification Search ............ 361/679.46, 361/679.48, 690, 694–695; 165/80.3; 312/223.2, 312/236; 415/213.1, 214.1; 454/184; 248/300, 248/309.1, 694
See application file for complete search history.

(56) References Cited

U.S. PATENT DOCUMENTS

| 6,826,048 | B1   | 11/2004 | Dean et al. |
| 7,245,490 | B2 * | 7/2007  | Chou et al. ................. 361/695 |
| 7,352,569 | B2 * | 4/2008  | Muenzer et al. ........ 361/679.33 |
| 7,511,955 | B2 * | 3/2009  | Yin ............................ 361/695 |
| 2008/0101019 | A1 * | 5/2008 | Tao ............................ 361/695 |
| 2008/0151495 | A1 * | 6/2008 | Yin et al. ................... 361/695 |
| 2008/0158813 | A1 * | 7/2008 | Yin ............................ 361/695 |
| 2009/0059521 | A1 * | 3/2009 | Yin ............................ 361/695 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A mounting apparatus for fan includes a receiving bracket for receiving the fan, and two securing boards for sandwiching the fan therebetween. The receiving bracket includes a pair of opposite sidewalls. A top flange is perpendicularly bent from a top edge of each sidewall. A slot is defined in the top flange and corresponding sidewall. The securing boards are perpendicular to the pair of sidewalls and mounted therebetween. Two securing tabs protrude laterally from two sides of each securing board and are respectively received in the slots of the receiving bracket. The securing tabs are blocked by the top flanges to prevent the securing boards moving with the fan in directions parallel to the sidewalls.

18 Claims, 4 Drawing Sheets

MOUNTING APPARATUS FOR FAN

BACKGROUND

1. Field of the Invention

The present invention relates to mounting apparatus, particularly to a mounting apparatus for mounting a fan to an electronic device enclosure.

2. Description of Related Art

Electronic devices typically generate heat during operation due to the flow of electricity through electronic components housed within the device. Electronic components may be damaged if this heat is not removed. Generally, an electronic device uses a fan to produce a flow of air for cooling the electronic components. Conventionally, a fan is mounted in the electronic device by a plurality of screws passing through corresponding holes of the fan, making it difficult and time consuming to replace or remove the fan for repair. Many electronic systems, such as servers, produce a great deal of heat because of the large number of electronic components contained therein. So, more than one fan may be required for cooling the components efficiently. Thus requiring many screws to mount the fans to the electronic device, making the replacement and removal process more difficult.

Accordingly, what is needed is a mounting apparatus whereby fans can be more easily attached and removed from the electronic device enclosure

SUMMARY

A mounting apparatus for fan includes a receiving bracket for receiving the fan, and two securing boards for sandwiching the fan therebetween. The receiving bracket includes a pair of opposite sidewalls. A top flange is perpendicularly bent from a top edge of each sidewall. A slot is defined in the top flange and extending to the sidewall. The securing boards are perpendicular to the pair of sidewalls and mounted therebetween. Two securing tabs protrude laterally from two sides of each securing board and are respectively received in the slots of the receiving bracket. The securing tabs are blocked by the top flanges to prevent the securing boards moving with the fan in directions parallel to the sidewalls.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
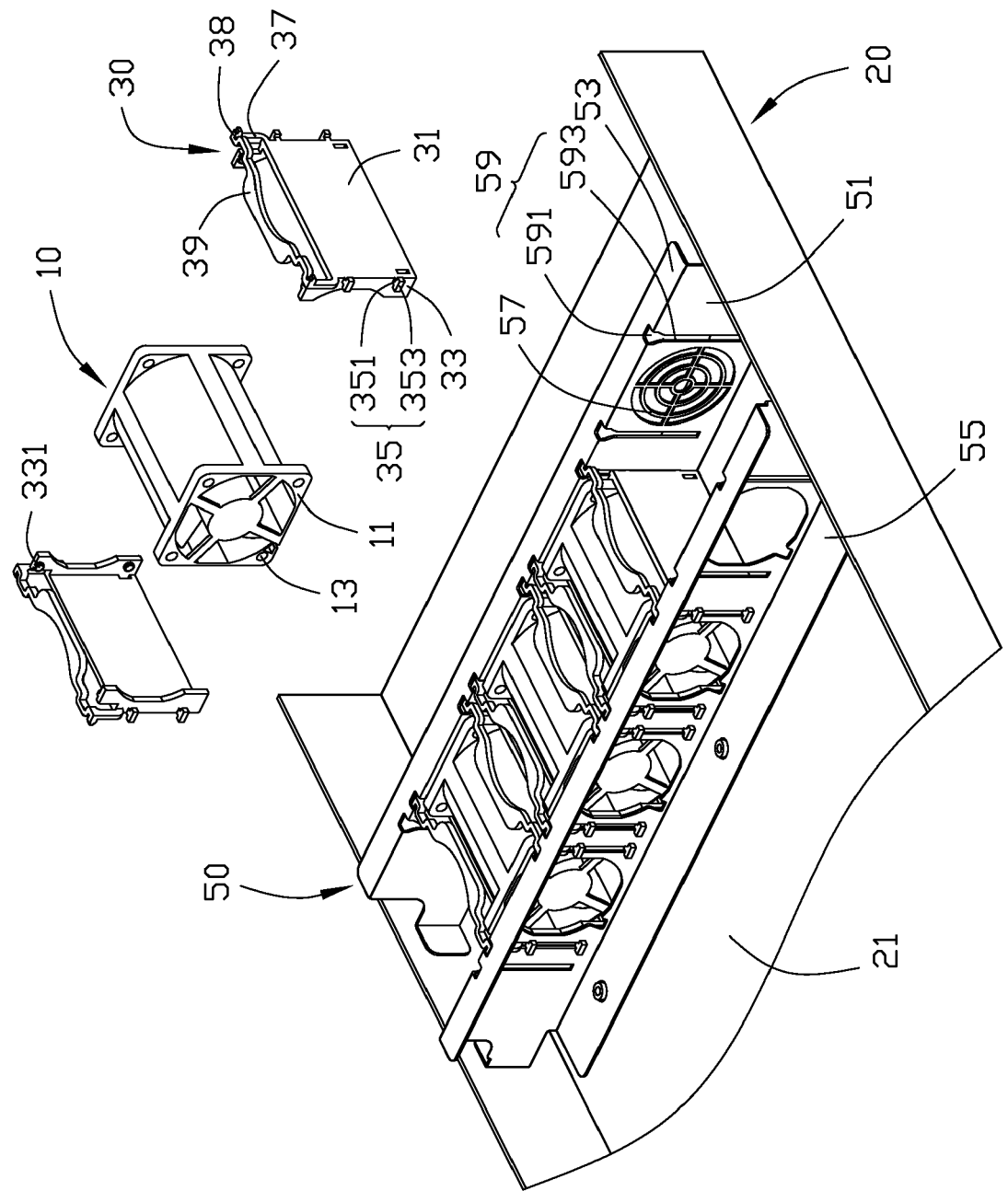
FIG. 1 is an isometric, perspective assembled view of a plurality of mounting apparatuses for mounting fans into an electronic device enclosure with an exploded view of one mounting apparatus and a fan.

Referring to FIG. 1, a mounting apparatus for mounting a fan 10 in an electronic device enclosure 20, includes a pair of securing boards 30 secured to two opposite sides of the fan 10 respectively, and a receiving bracket 50 secured in the electronic device enclosure 20 on a bottom wall 21 thereof for receiving the fan 10. The fan 10 includes two opposite sidewalls 11. Four securing holes 13 are defined at four corners of each sidewall 111 respectively.

Figure 2:
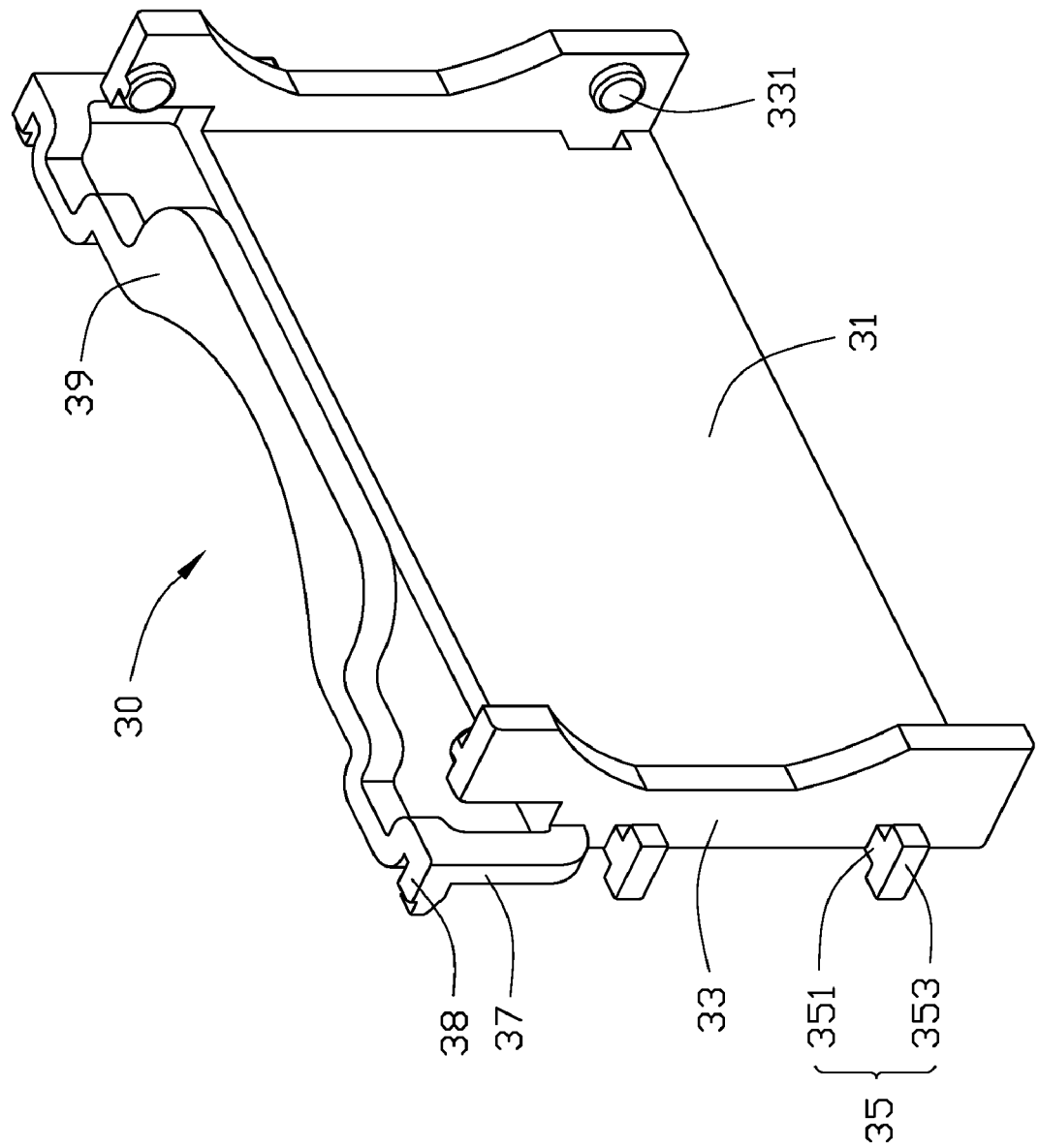
FIG. 2 is an isometric, enlarged view of a securing member of the mounting apparatus.

Referring also to FIG. 2, each securing board 30 includes a rectangular base 31. A pair of ears 33 is perpendicularly bent from two opposite edges of the base 31 respectively. A pair of positioning posts 331 protrudes from an inner surface of each ear 33 at an upper end and a lower end thereof respectively, corresponding to the securing holes 13 of the fan 10. A pair of T-shaped securing members 35 aligned in a vertical direction spacedly protrudes from an outer surface of each ear 33 at an edge thereof adjacent to the base 31. Each securing member 35 includes a sliding portion 351 perpendicularly protruding from the outer surface of the ear 33 and a blocking portion 353 connected to the sliding portion 351 and perpendicular to the base 31. An elastic supporting arm 37 in alignment with the securing members 35 extends up from an upper edge of the ear 33 above the securing members 35. A stepped securing tab 38 protrudes from a top edge of the supporting arm 37 in a direction perpendicular to the base 31. The stepped securing tab 38 includes a horizontal portion 381 and a vertical portion 383 (shown in FIG. 3). A bent handle 39 is connected between the supporting arms 37 at the top edges thereof for users to operate.

The receiving bracket 50 is mounted in the electronic device enclosure 20, which includes two opposite sidewalls 51. A receiving space for accommodating a plurality of fans 10 is defined between the two sidewalls 51. A top flange 53 and a bottom flange 55 are bent from a top edge and a bottom edge respectively of each sidewall 51. The bottom flanges 55 of the sidewalls 51 are secured in the electronic device enclosure 20. Each sidewall 51 defines a plurality of ventilating areas 57 corresponding to the fans 10. A pair of slots 59 is defined at opposite sides of each ventilating area 57 extending vertically from the top flange 53 to near the bottom edge of the sidewall 51. The slots 59 in one of the two sidewalls 51 align with the corresponding slots 59 in the other of the two sidewalls 51. Each slot 59 includes a wide guiding portion 591 defined in the top flange 53 for the blocking portion 353 of the securing member 35 on the securing board 30 inserting therein and a thin limiting portion 593 for the sliding portion 351 of the securing member 35 to be received therein. The blocking portion 353 is perpendicular to an extending direction of the limiting portion 593 of the slot 59, and a length of the blocking portion 353 is greater than the width of the limiting portion 593 of the slot 59.

Figure 3:
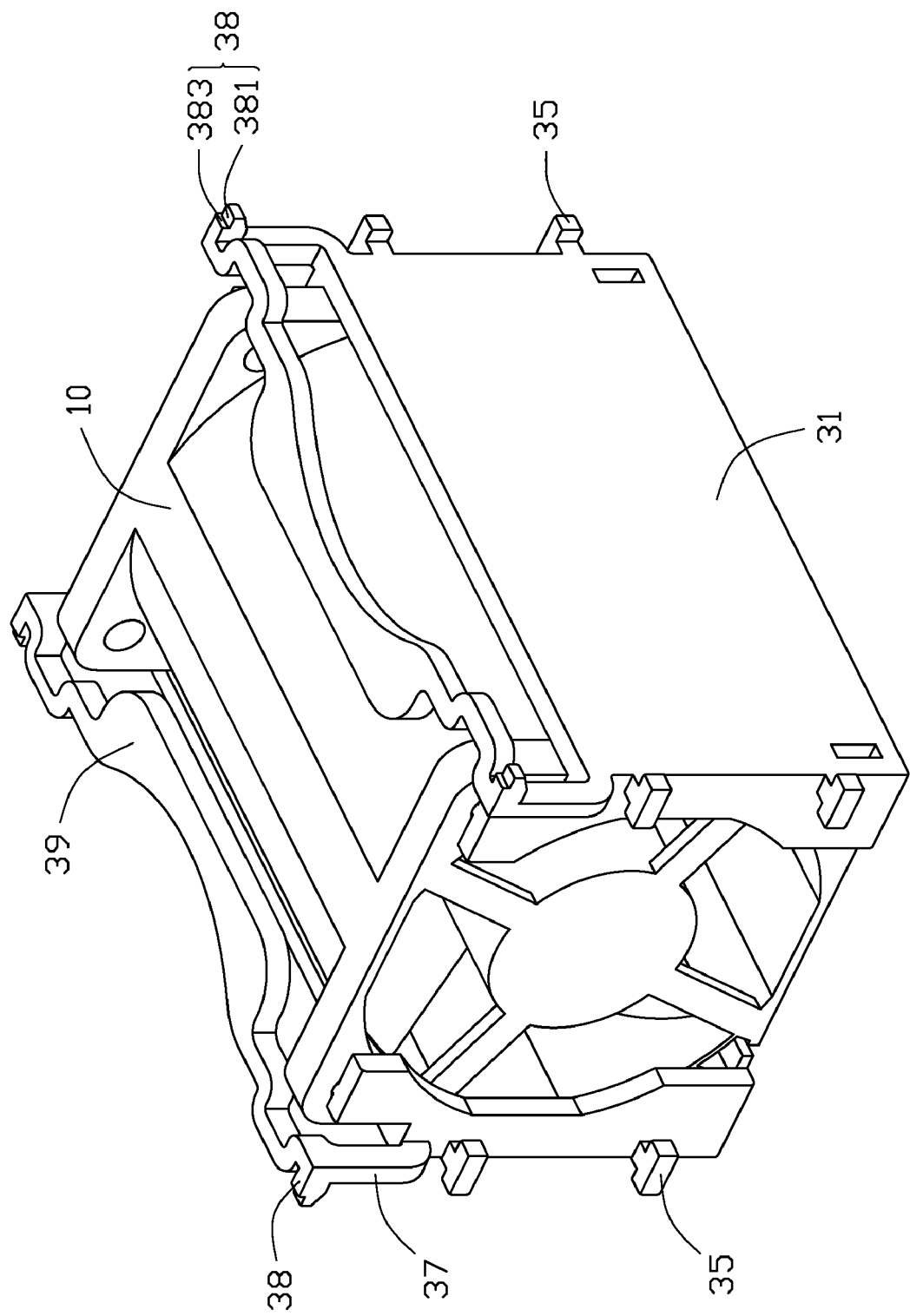
FIG. 3 is an isometric, assembled view of the securing member and the fan.
Figure 4:
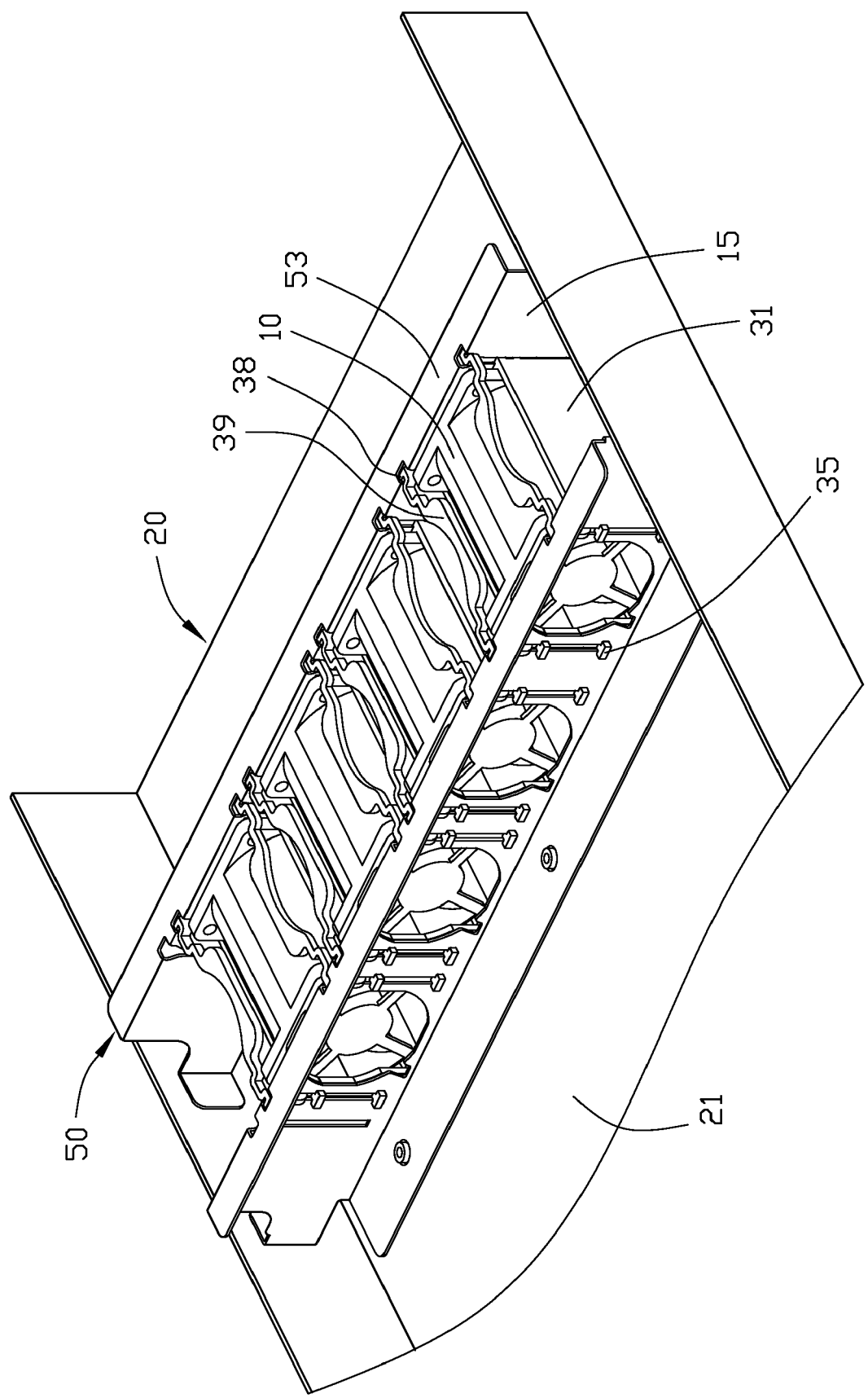
FIG. 4 is an isometric, entirely assembled view of FIG. 1.

Referring also to FIGS. 3-4, in assembly, the ears 33 of each securing board 30 are forced to deform oppositely first, and the positioning posts 331 of the ears 33 align with the corresponding securing holes 13 in the fan 10. Then the ears 33 are released to rebound, the positioning posts 331 engage in the securing holes 13, thereby the pair of securing boards 30 is secured to the fan 10 and sandwich the fan 10 between the bases 31 thereof to form a fan module. Secondly, the blocking portions 353 of the securing members 35 on the securing boards 30 are respectively inserted in the guiding portions 591 of the corresponding slots 59 in the two sidewalls 51 of the receiving bracket 50. The securing boards 30 are pushed down toward the bottom wall 21 of the electronic device enclosure 20. The sliding portions 351 of the securing members 35 slide along the corresponding limiting portions 593 of the slot 59. The blocking portions 353 are respectively blocked by the sidewalls 51 beside the slots 59, thereby limiting a movement of the fan module in a direction perpendicular to the sidewalls 51. Then the securing boards 30 are moved to a position where the securing tabs 38 are close to the top flanges 53 of the sidewalls 51, the supporting arms 37 are received in the limiting slots 593, and the securing tabs 38 protruding from the supporting arms 37 are blocked on the top flanges 53 of the sidewalls 51 to prevent the fan module moving down further. Then, the handles 39 of the two securing boards 30 are pressed toward each other. The handles 39 are elastically deformed and drive the securing tabs 38 of the securing boards 30 to retract toward the fan 10 and not be blocked by the top flanges 53 of the sidewalls 51. The fan module is pushed down again. The securing tabs 38 are received in the guiding portions 591 of the slots 59. Releasing the handles 39 of the securing boards 30, the securing tabs 38 rebound and move away from the fan 10. The horizontal portions of the securing tabs 38 move to beneath the top flanges 53 of the sidewalls 51 and are blocked by the top flange 53 and the sidewall 51, to prevent the fan module moving out from the receiving bracket 50. And the vertical portions of the securing tabs 38 abut against edges of the guiding portions 591 of the slots 59. Thus, the fan module is securely mounted in the receiving bracket 50.

In disassembly, the handles 39 of the securing boards 30 are pressed toward each other. The handles 39 elastically deform and drive the securing tabs 38 of the securing boards 30 to retract and not be blocked by the top flanges 53 of the sidewalls 51 of the receiving bracket 50. Then, the handles 39 are pulled up. The T-shaped securing members 35 slide out from the slots 59 of the sidewalls 51. Thus, the fan module is disassembled from the receiving bracket 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for a fan comprising:
a receiving bracket for receiving the fan, comprising a pair of opposite sidewalls, a top flange perpendicularly bent from a top edge of each sidewall, and a slot defined in each of the top flanges and corresponding sidewalls; and
two securing boards sandwiching the fan therebetween, the securing boards perpendicular to the pair of sidewalls of the receiving bracket and mounted therebetween, at least one securing member protruding from each of two opposite sides of each securing board, the at least one securing member is slidable along the corresponding slot of the receiving bracket and blocked by the corresponding sidewall of the receiving bracket from moving perpendicular to the length of the corresponding slot.

2. The mounting apparatus for a fan as described in claim 1, wherein each securing board comprises a rectangular base and two opposite ears perpendicularly extending therefrom, and a positioning post protruding from an inner surface of each ear corresponding to a securing hole defined in one side of the fan.

3. The mounting apparatus for a fan as described in claim 2, wherein the at lest one securing member protrudes toward the corresponding sidewall of the receiving bracket from an outer surface of each ear, and configured for engaging with the slot in the receiving bracket.

4. The mounting apparatus for a fan as described in claim 3, wherein the at least one securing member is T-shaped, comprising a sliding portion protruding from the ear and a blocking portion perpendicular to the sliding portion, and the slot comprises a wide guiding portion defined in the top flange of the receiving bracket, and a narrow limiting portion defined in the sidewall, the blocking portion is perpendicular to an extending direction of the limiting portion and blocked by the sidewall beside the limiting portion.

5. The mounting apparatus for a fan as described in claim 3, wherein an elastic supporting arm protrudes up from each ear above the securing member, and a securing tab perpendicularly protrudes from a top edge of the supporting arm in a direction perpendicular to the base of the securing board.

6. The mounting apparatus for a fan as described in claim 5, wherein the securing tab comprises a horizontal portion blocked beneath the top flange of the sidewall and a vertical portion abuts against an edge of the guiding portion of the slot in the top flange.

7. The mounting apparatus for a fan as described in claim 5, wherein each securing board further comprises a bent handle connected between the top edges of the supporting arms.

8. A fan mounting assembly comprising:
a fan;
two securing boards, each securing board comprises a base and is attached to a side of the fan, two securing tabs protruding laterally from two sides of the base, and an elastic handle connected between the two securing tabs; and
a receiving bracket for receiving the fan with securing boards, comprising a pair of opposite sidewalls, a top flange perpendicularly bent from a top edge of each sidewall, the securing tabs being blocked by the top flanges to prevent the fan moving out of the receiving bracket; the elastic handle is capable of being deflected away from the base to drive the securing tabs of the securing boards to release from the top flanges.

9. The fan mounting assembly as described in claim 8, wherein the fan comprises two opposite sidewalls, each sidewall defines a plurality of securing holes; each securing board comprises two ears perpendicular to the base, and at least one positioning post protrudes from an inner surface of each ear corresponding to one securing hole of the fan.

10. The fan mounting assembly as described in claim 9, wherein a slot is defined in each top flange and extending to the corresponding sidewall, a securing member protrudes toward the corresponding sidewall of the receiving bracket from an outer surface of each ear for engaging with the slot in the receiving bracket.

11. The fan mounting assembly as described in claim 10, wherein the securing member is T-shaped, comprising a sliding portion perpendicularly protrudes from the ear and a blocking portion perpendicular to the sliding portion, and the slot comprises a wide guiding portion defined in the top flange for the blocking portion entering the slot therefrom and a narrow limiting portion defined in the sidewall for the sliding portion sliding therein, the blocking portion is perpendicular to an extending direction of the limiting portion and the limiting portion is located between the blocking portion and the ear.

12. The fan mounting assembly as described in claim 10, wherein an elastic supporting arm protrudes up from each ear above the securing member, and the securing tab perpendicularly protrudes from one side of a top edge of the supporting arm in a direction perpendicular to the base of the securing board.

13. The fan mounting assembly as described in claim 12, wherein the securing tab comprises a horizontal portion blocked beneath the top flange and a vertical portion abuts against an edge of the guiding portion of the slot in the top flange.

14. The fan mounting assembly as described in claim 12, wherein the elastic handle is connected between the top edges of the supporting arms.

15. A fan mounting assembly comprising:
a bottom plate;
two opposite side plates substantially perpendicularly mounted on the bottom plate, each of the side plates having an engaging opening defined therein;
a fan mounted between the side plates on the bottom plate; and
two securing boards sandwiching the fan therebetween, opposite ends of each of the securing boards engaging a corresponding engaging opening of each of the side plates and being slideable along the engaging openings in a direction perpendicular to the bottom plate, each of the securing boards having a board body and an elastic supporting arm with a locking protrusion formed thereon, the locking protrusion of the securing boards protruding away from each other, the elastic supporting arms of the securing boards being manually deformable to move toward each other so as to cause the locking protrusion to disengage from the engaging opening of the respective side plate.

16. The fan mounting assembly as described in claim 15, wherein each elastic supporting arm laterally extends from one side of corresponding board body and is deflectable away from the board body to cause the locking protrusion to disengage from the engaging opening of the respective side plate.

17. The fan mounting assembly as described in claim 16, wherein each side plate comprises a top flange parallel to the bottom plate; and the engaging opening comprises a wide guiding portion defined in the top flange, and the locking protrusions are received in the wide guiding portion and blocked beneath the wide guiding portion.

18. The fan mounting assembly as described in claim 17, wherein each engaging opening comprises a narrow limiting portion defined in the sidewall, the limiting portion communicates with the wide guiding portion; and two securing members protrude from two opposite sides of each securing boards, and the securing members are slidable along the narrow limiting portion and blocked by the sidewall beside the limiting portion.

\* \* \* \* \*